United States Patent [19]

Seitz

[11] Patent Number: 5,499,189
[45] Date of Patent: Mar. 12, 1996

[54] SIGNAL PROCESSING METHOD AND APPARATUS FOR DISCRIMINATING BETWEEN PERIODIC AND RANDOM NOISE PULSES

[75] Inventor: Forrest S. Seitz, Beaverton, Oreg.

[73] Assignee: Radar Engineers, Portland, Oreg.

[21] Appl. No.: 949,040

[22] Filed: Sep. 21, 1992

[51] Int. Cl.$^6$ ................................................. G01R 31/08
[52] U.S. Cl. .......................................... 364/480; 324/536
[58] Field of Search ..................................... 364/480, 481, 364/483, 492; 324/536, 500, 508, 522, 750, 754, 555, 613; 340/310.03

[56] References Cited

U.S. PATENT DOCUMENTS

| | | | |
|---|---|---|---|
| 3,539,922 | 11/1970 | Brockman | 324/111 |
| 3,602,821 | 8/1971 | Juroff | 328/165 |
| 3,783,387 | 1/1974 | Wernli | 325/348 |
| 4,347,827 | 9/1982 | LoCascio | 123/618 |
| 4,414,534 | 11/1983 | Whidden | 340/658 |
| 4,439,723 | 3/1984 | Loftness | 324/52 |
| 4,585,997 | 4/1986 | Lin | 328/165 |
| 4,609,866 | 9/1986 | Loftness | 324/52 |
| 4,731,586 | 3/1988 | Perkins | 324/536 |
| 5,029,118 | 7/1991 | Nakajima et al. | 364/572 |
| 5,223,795 | 6/1993 | Blades | 324/536 |
| 5,373,241 | 12/1994 | Ham, Jr. et al. | 324/536 |

OTHER PUBLICATIONS

"PLI–150 Interference Locator System," Trilithic brochure, 2 pages.
"Hand–held EMI/RFI Detector," ABN, Inc. Advertisement, one page.
"Oak RF Interference Locator Model F–300," Oak Industries, Inc. Advertisement, 1977.
"Model 700 Interference Locator," Sprague Engineering Bulletin No. 90033, Sprague Electric Company, 1979, 5 pages.
"The Super Snoop Will Pinpoint the Noise Source to the Exact Pole," Micro Tech Mfg. Inc., 2 pages.
"Pinpoint the Source of R–F and TVI Noise with Little Snoop Interference Locator," Micro Tech Mfg. Inc., 4 pages.
"DDF Defect Direction Finding Locator Model 237," Radar Engineers, 2 pages.
"Sadelco Model FS 4–VU Signal Level Meter," Sadelco, Inc., 2 pages.
"Vehicular Locating System for Radio/TV Interference," Radar Engineers, 2 pages.
"Hotstick Line Sniffer Model 247," Radar Engineers, Oct., 1991, 2 pages.
"Operations Manual Model 237 DDF Locator," Radar Engineers booklet, 20 pages.
Clark, "Cancel 60 Hz and Other Noise," Electronic Design 20, Sep. 27, 1976, pp. 74–79.

Primary Examiner—James P. Trammell
Assistant Examiner—Craig Steven Miller
Attorney, Agent, or Firm—Klarquist Sparkman Campbell Leigh & Whinston

[57] ABSTRACT

Specific noise components in an input signal are identified and isolated for processing in a desired manner. The method comprises determining an interval during which the noise component is expected to occur and isolating a portion of the input signal occurring during that interval. Determination of the interval is made by sensing noise impulses in the input signal, temporally correlating the noise impulses, and estimating the time that the noise impulses are expected to recur. The input signal can then be passed during the interval to an output signal to enhance the noise component, or the input signal can be blanked from the output signal to reduce the noise component.

27 Claims, 6 Drawing Sheets

SIGNAL PROCESSING METHOD AND APPARATUS FOR DISCRIMINATING BETWEEN PERIODIC AND RANDOM NOISE PULSES

FIELD OF THE INVENTION

The present invention relates generally to apparatus for filtering an input signal, and more particularly relates to a method and apparatus for isolating specific noise components in an input signal so they can be processed in a desired manner.

BACKGROUND AND SUMMARY OF THE INVENTION

For expository convenience, the present invention will be illustrated with reference to one particular application thereof, namely that of sensing sparking noise from electrical power lines. However, it should be recognized that the invention is not so limited.

Electrical power lines carry a signal which is typically a periodic 60 Hz AC voltage. In an AC signal, the voltage potential varies as a sinusoid between positive and negative maximum values with periodic zero crossings.

At the zero crossings, the power line has a voltage potential near that of ground. At the maximum excursions of the signal, however, there may be enough of a potential difference between the power line and adjacent objects to induce a spark. Sparking is most likely to occur with high voltage power lines, or in settings where the physical integrity of the power line is compromised (i.e. loose hardware, etc.). However, sparking can occur wherever there is a power signal, and is thus a widespread phenomenon.

Sparks create wideband radio frequency (RF) signals that can interfere with all manner of radio and television equipment. However, the radio signals produced by such sparking also provide a means by which the sparking power line can be tracked down and identified. Electric utility companies often have crews of troubleshooters who utilize radio receivers and directional antennas to locate sparking power lines so they might be repaired. In this way, interference to radio and television equipment can be traced and eliminated.

A hindrance to such tracing of sparking power lines is that power lines are not the only sources of electrical sparks. Vehicle ignition systems (e.g. "spark" plugs) also produce spark noise that generates similar RF interference. Due to the alternating voltage of power signals, power line sparking generally occurs with a repetition rate of 60 Hz (120 Hz in instances where sparking occurs with equal regularity on the positive and negative excursions). Depending on engine speed, vehicle ignition systems can also generate sparks at 60 Hz and multiples thereof. RF interference from vehicle ignition systems is especially troublesome when attempting to trace a sparking power line while traveling in a motor vehicle.

There are some differences between periodic ignition sparks and power line sparks. Power line sparks typically occur more than once during a 60 Hz sinusoidal power signal cycle. Sparks may occur during the negative half as well as the positive half of the power signal cycle. Also, after a spark occurs, the potential difference is quickly recharged to a voltage where sparking may again occur. (The power line may be modelled as an R-C circuit, with a capacitance formed by an insulator, and then a large resistance—such as a wooden pole—to ground.) Since the recharging is quick, several sparks and recharges usually occur in succession during the same half cycle of the power signal. Thus, during each half cycle, a series of several closely spaced sparks typically occur.

In accordance with the present invention, a method and apparatus are provided for isolating specific noise components in an input signal so they can be processed in a desired manner. The method comprises determining an interval during which the noise component is expected to occur, and isolating a portion of the input signal occurring during that interval. Determination of the interval is made by sensing noise impulses in the input signal, temporally correlating the noise impulses, and estimating the time that the noise impulses are expected to recur. The input signal can then be passed during the interval to an output signal to enhance the noise component, or the input signal can be blanked from the output signal to reduce the noise component.

The preferred apparatus comprises a noise impulse detector, a memory, an electronic switch, and a general purpose processor programmed according to the method of the present invention. The noise impulse detector senses noise impulses in an input signal. The time that noise impulses are sensed is recorded by the processor in the memory. The processor also temporally correlates the sensed noise impulses to determine an interval during which a particular noise component of the input signal is expected to recur. The processor actuates the electronic switch during the interval to pass or blank the input signal during the interval.

The present invention has particular application to the detection of radio frequency interference or noise impulses caused by power line sparks. As described above, such noise impulses can be expected to occur at intervals correlated to a 60 Hz power signal cycle. Thus, a window of time during which a power line spark may be expected will occur approximately one 60 Hz cycle (16.7 milliseconds) after a first power line spark is detected. Therefore, the present invention can be practiced by receiving a radio frequency input signal containing wideband noise from power line sparks, detecting a noise impulse, predicting an interval for a next noise impulse (i.e. approximately 16.7 milliseconds after the detected noise impulse), and passing the input signal during the predicted interval. This particular application of the present invention effectively passes power line noise while blanking non-periodic noise. Of course, non-periodic noise which coincidently occurs during those intervals in which the input signal is passed will not be blanked.

The foregoing implementation of the invention, however, does not discriminate against other sources of 60 Hz noise. As described above, other sources of periodic 60 Hz noise impulses exist, and these sources would also be detected by the foregoing technique. Accordingly, the methodology may be further refined by exploiting a unique characteristic of power line sparks, such as their tendency to occur in closely spaced groups. In such a refined methodology, it is not enough that a second noise impulse be detected approximately 16.7 milliseconds after a first impulse. Instead, the second noise impulse must be detected approximately 16.7 milliseconds after a group of closely spaced first noise pulses. Thus implemented, the present invention enhances the radio frequency interference caused by power line sparks while blanking non-periodic noise and periodic noise from other sources.

Additional features and advantages of the present invention will be made apparent from the following detailed description of a preferred embodiment, which proceeds with reference to the accompanying drawings.

DETAILED DESCRIPTION OF THE PREFERRED EMBODIMENT

Figure 1:
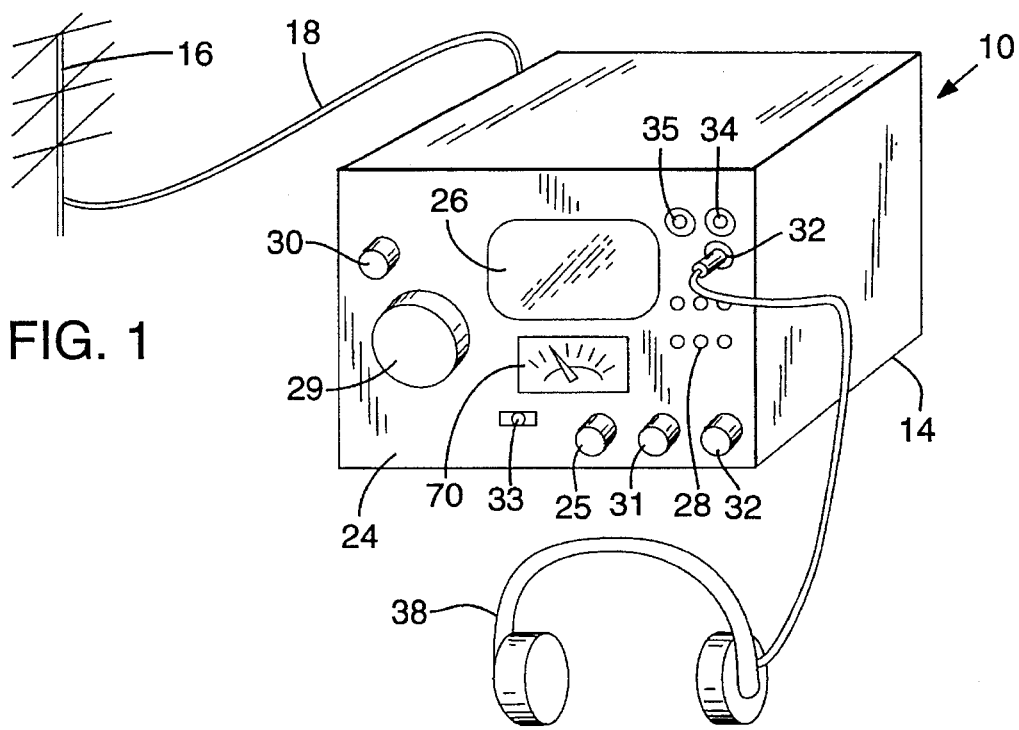
FIG. 1 is a perspective view of an apparatus for blanking non-periodic noise according to a preferred embodiment of the present invention.

With reference to FIG. 1, and in accordance with a preferred embodiment of the invention, an apparatus 10 for blanking non-periodic noise is provided. The apparatus is typically used by employees of a utility company to identify a particular location in the field at which a power line may be sparking. The apparatus is preferably embodied in a hand-held instrument for portability in the field. Accordingly, the apparatus comprises a box-shaped instrument housing 14 which may be carried over the shoulder in a carry case. Alternately, the apparatus may be embodied as a vehicle-mounted instrument.

The apparatus further comprises a hand-held directional antenna 16 which is connected to the instrument housing 14 using a coaxial cable 18. The coaxial cable attaches to a BNC connector 20 provided on the housing (shown in FIG. 2). The directional antenna can be directed towards an electrical power line so as to receive a radio frequency signal (the input signal) containing any interference caused by sparking at that location along the power line.

On a face 24 of the apparatus 10, there is a visual display 26, such as an LCD display, for indicating the frequency to which the apparatus is tuned. Also provided is a set of controls including a band selecting switch 28, a volume control knob 25, a frequency knob 29, a gain knob 30, a video level knob 31, a sync knob 32, a digital filter bypass switch 33, and a meter 70 (FIG. 2).

The apparatus 10 also comprises an audio jack 37, a video connector 34, and a synch connector 35. A set of headphones 38 can be connected to the apparatus by plugging the headphones into the audio jack 37. When the headphones are connected, the speaker 68 is automatically mute. The headphones/speaker provide an audible indication of the radio frequency interference caused by power line sparks. The video connector 34 permits attachment of an oscilloscope or other signal measurement instrument for analysis and display of the input signal after processing by the apparatus. A 60 Hz synchronization signal is provided at the synch connector 35 for such instruments. (Video output is also provided on the tip ring of the audio jack 37.)

Figure 2:
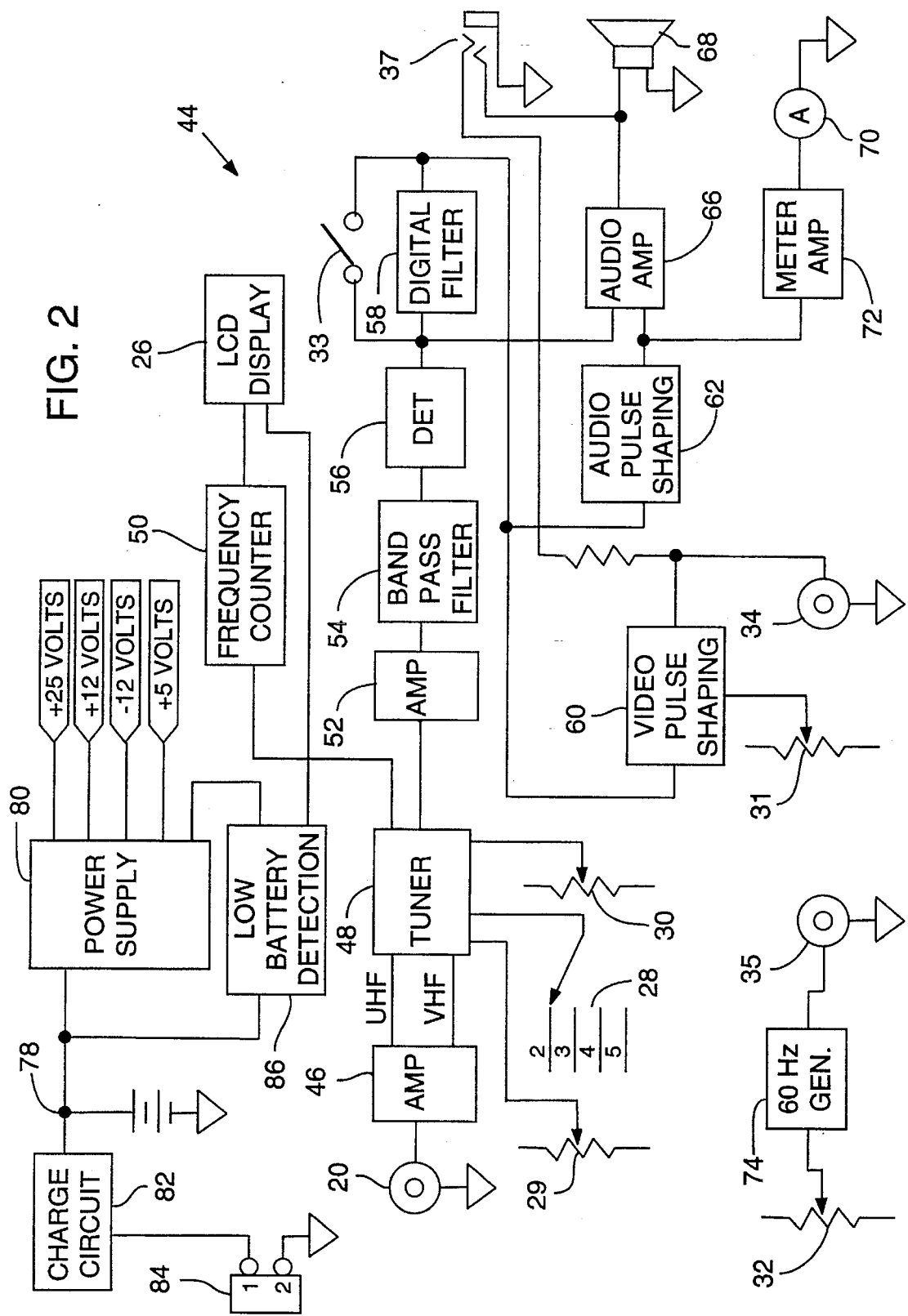
FIG. 2 is a block diagram of a circuit in the apparatus of FIG. 1.

Enclosed in the housing 14 of the apparatus 10 is a circuit 44 as shown in FIG. 2. The input signal from the directional antenna 16 is received by the circuit at the BNC connector 20. The input signal is amplified with an amplifier 46. A tuner 48, consisting of a variable frequency local oscillator and mixer, tunes a selected frequency of the input signal as selected by the band selection switch 28 and the frequency knob 29. A frequency counter 50 determines the frequency of the tuned input signal and displays the measured value of the frequency on the display 26. Since power line sparks create noise spreading across virtually the entire frequency spectrum, nearly any frequency would contain noise impulses from a power line spark. However, in order to minimize interference from other sources of radio frequency signals (and to avoid possible nulls in the spectral distribution of the noise due to the sin(x)/x frequency character of a finite noise impulse) it is desirable to tune to a specific frequency. Tuning of a frequency in the very high frequency (VHF) range is normally more effective for locating a group of utility poles that contain the source of power line sparks. Frequencies in the ultra high frequency (UHF) range are tuned to identify a specific utility pole where the spark source is located.

The tuner 48 provide an intermediate frequency (IF) signal at 45 Mhz having a bandwidth of about 6 Mhz. This IF signal is next filtered by a band pass filter 54. The band pass filter operates to limit the rise and fall times of noise impulses in the input signal. The filter output is provided to an RF detector 56.

Figure 3:
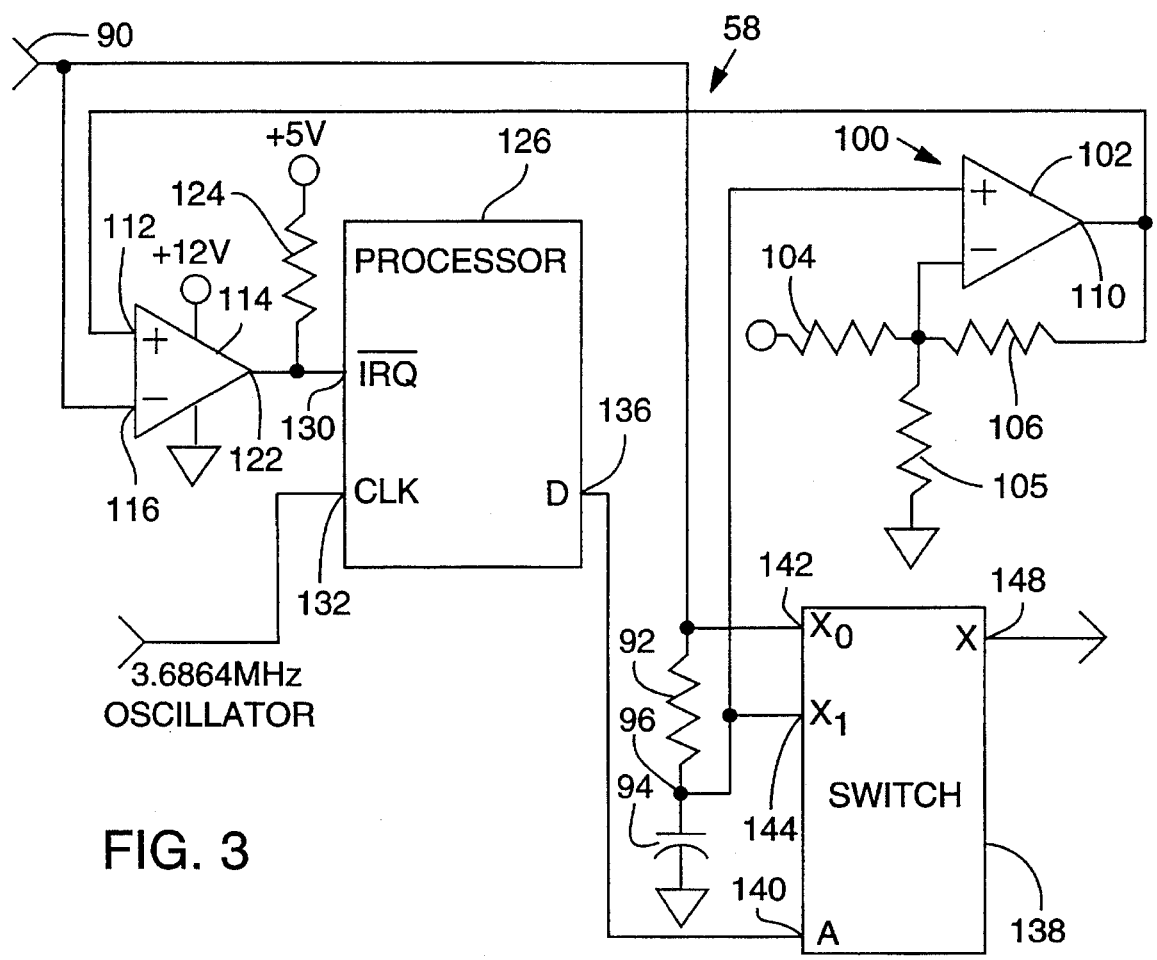
FIG. 3 is a schematic diagram of a portion of the circuit of FIG. 2.

Connected after the detector 56 is a digital filter 58. The digital filter 58 implements the method for blanking non-periodic noise of the present invention. The filter operates to blank non-periodic noise from the input signal while passing periodic noise impulses of the type produced by power line sparks. Operation of the digital filter 58 is illustrated in FIG. 3 and described in more detail below. The digital filter 58 may be disabled by the filter bypass switch 33.

After processing by the digital filter, the input signal should contain only those noise impulses caused by power line sparks. Since the noise impulses are of very short duration, they must be re-shaped by audio and video pulse shaping circuits 62, 64 to be perceptible using the headphones 38 or an external oscilloscope. The audio pulse shaping circuit 62 is preferably implemented as a peak detector with a slow decay. The processed input signal is amplified by an audio amplifier 66 which drives the headphone jack 37 or a built-in speaker 68 with the processed input signal. The output of the audio pulse shaping circuit 62 is also provided to the built-in meter 70 through a meter amplifier 72.

The video pulse shaping circuit 64 is similar, extending noise impulses to make them more easily perceptible on an oscilloscope screen. The video pulse shaping circuit also provides an adjustment of the amplitude of the video signal using video level knob 31. The output of the video pulse shaping circuit is provided to an externally attached oscilloscope through the video connector 34.

A synchronizing 60 Hz signal for the oscilloscope is provided by a 60 Hz generator 74 at the synch connector 35. The frequency of the synchronizing signal can be adjusted using the synch knob 32.

Power is provided to the circuit 44 by a rechargeable battery 78 and power supply circuit 80. The power supply circuit 80 generates various power supply voltages required by the circuit. The battery 78 can be recharged from a 12 volt source connected to a charging circuit 82 by a charge connector 84. The condition of the battery 78 is monitored by low battery detection circuit 86 and displayed on the LCD display 26.

FIG. 3 illustrates in greater detail the digital filter 58 which implements the present invention. A first portion of the circuit performs the function of detecting a noise impulse in the input signal. The input signal is received at an input 90 to the digital filter 58 after being tuned, filtered, and amplified by the circuit 44. A resistor 92 and a capacitor 94 are connected in series between the input 90 and ground. The resistor and capacitor form a DC voltage at their junction 96 equal to the average DC level of the input signal.

The average DC level is used to determine a threshold value in a multiplier circuit 100. The multiplier circuit 100 comprises an operational amplifier 102 (type TL084) and resistors 104, 105, 106. The average DC level of the input signal is received at a positive input 108 of the operational amplifier. The resistors 104, 105, 106 are connected to the operational amplifier in a well known manner to cause the operational amplifier to produce at an output 110 a threshold value signal which is preferably approximately six times the average DC level. (A small offset voltage, on the order of 20 millivolts, is provided to the left side of resistor 104.)

The threshold value signal is received at a positive input 112 of a comparator 114 (type LM393), which serves as a threshold level detector. The comparator compares the signal from input 90 to the threshold value set by the operational amplifier 102. When the input signal exceeds the threshold value signal, the comparator generates an interrupt signal at an output 122. Since the threshold level is set at about six times the average DC level of the input signal, the interrupt signal should only be generated when there is a noise impulse in the input signal. A resistor 124 is connected at the output 122 and operates as a pull up resistor since the comparator has an open collector output.

Figure 4:
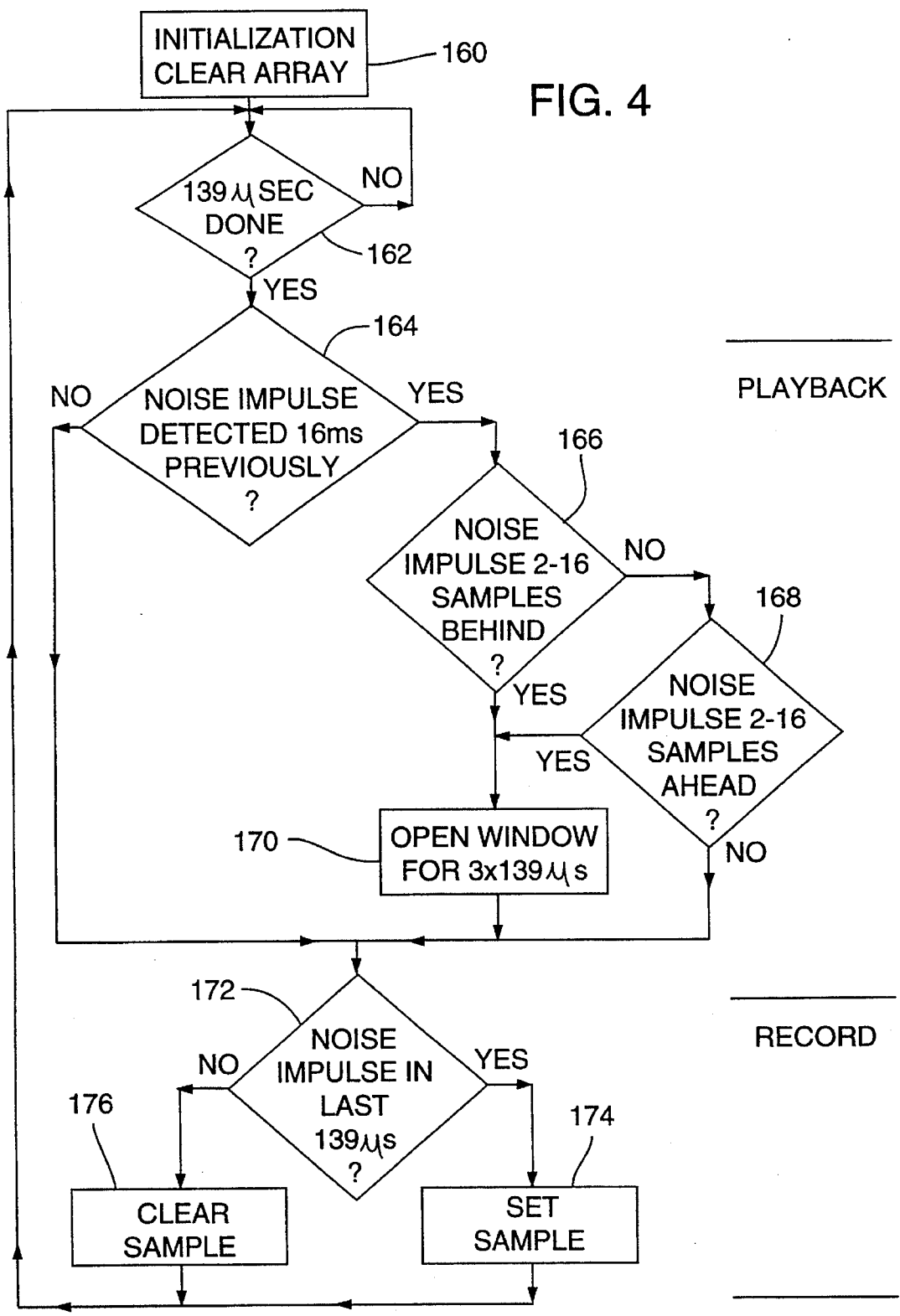
FIG. 4 is a flow chart of basic steps in a process for blanking non-periodic noise according to a preferred embodiment of the present invention.

A further portion of the digital filter 58 operates to temporally correlate detected noise impulses with the period of an AC power signal and to estimate intervals during which noise impulses caused by power line sparks are expected to occur. In the preferred embodiment, this portion of the digital filter comprises a general purpose processor 126 (i.e. Motorola type MC68HC05) programmed to execute the method of the present invention, as described in greater detail below in connection with the flow charts of FIG. 4. The processor 126 includes an interrupt request (IRQ) input 130 and a clock input 132. The IRQ input receives the interrupt signal generated by the second operational amplifier 114. The microprocessor further includes internally a flip-flop connected to the IRQ input which stores an interrupt signal until serviced by the processor's program. In the preferred embodiment, the clock input is driven with a 3.6864 MHz clock signal. However, other frequencies can be used for the clock signal if sufficiently fast for the processor to timely complete its programmed process.

In the preferred embodiment, the processor 126 is programmed to service interrupts 120 times at uniform intervals during each cycle of a 60 Hz signal. Each 60 Hz cycle is approximately 16.7 milliseconds. For each interrupt serviced, the contents of the internal flip-flop connected to the IRQ input 130 are stored at consecutive locations of a data array. In the illustrated embodiment, the data array is maintained in the microprocessor's built-in RAM memory. (In other embodiments, of course, an externally connected memory addressable by the processor could be used.) In this manner, a history of the times at which noise impulses occurred during the previous cycle is maintained.

The processor 126 is further programmed to determine from the data array an interval during which a noise impulse caused by power line sparks is expected to occur. The time that noise impulses from power line sparks are expected to occur is predicted from the times that noise impulses occurred during the previous cycle as indicated by the data array. The process for predicting this interval will be made more apparent in the description of the flow chart of FIG. 4 below.

The processor also controls a last portion of the digital filter which operates to blank periodic noise from the input signal. The processor has a data output 136 which it drives with a switch control signal according to its program. The switch control signal operates an electronic switch 138 and is received by the switch at a control input 140. The electronic switch has a first input 142 at which the input signal is received. A second input 144 receives the average DC value of the input signal from the juncture 96 of the resistor 92 and the capacitor 94. During the intervals predicted by the processor for occurrence of noise impulses from power line sparks, the switch control signal operates the switch to connect the input signal to a switch output 148. Otherwise, the switch control signal causes the switch to connect the average DC level of the input signal to the switch output. Thus, the digital filter 58 effectively blanks non-periodic noise from the input signal while passing the desired periodic noise impulses from power line sparks.

The processor 126 is programmed to implement a method for blanking non-periodic noise (the process) according to the preferred embodiment of the present invention. The steps of the process are generally illustrated in flow chart form by FIG. 4.

Basically, the process includes two phases: playback and record. In the playback phase, a historical determination is made to see whether a noise impulse was detected during a corresponding sample period of the preceding cycle. If so, the historical record is further checked to determine whether there was a second historical pulse close to the first ("close" here meaning within 16 sample periods of the first pulse, as recorded in the data array). If so, switch 138 is closed to pass the received signal to the output 148 for a brief interval. In the second, record, phase of the process, the current input signal is sampled and a data bit is written to the data array: a "1" if a noise impulse was detected, a "0" otherwise. This record serves as the historical record during the next cycle (at which time it is overwritten). The foregoing will become clearer from the following discussion of FIG. 4.

In a first initialization step 160 of the process, the processor 126 clears a data array. As described above, the data array will be used to store a history of the times that noise impulses occurred during a 60 Hz cycle. Each bit of the array stores an indication of whether a noise impulse was detected during one of the 120 sample periods during the previous 60 Hz cycle. In the preferred embodiment, however, the data array actually comprises an array of only 116 bits. The array is shortened from 120 to 116 bits to anticipate the interval during which a noise impulse is expected and to account for delays in the sampling of noise impulses in the input signal.

Next in the flow chart is an idling step 162 in which the processor idles until the completion of a 139 microsecond sample period. When a sample period is complete, the processor proceeds to the step 164 of determining whether a first noise impulse occurred one 60 Hz cycle (16.7 milliseconds) previously. (As detailed below, this is somewhat of an oversimplification; the step more accurately entails examining a period of time centered about a time approximately 16.7 milliseconds previously.) The data array is consulted to make this determination. Each bit of the data array stores an indication of whether a noise impulse was detected during a sample period of the previous cycle. The bit corresponding to the sample period which occurred 16.7 milliseconds previously (the critical sample period) will be set if a noise impulse occurred in that sample period.

If a noise impulse is determined to have occurred in the critical sample period, the processor then determines whether a second noise impulse occurred within 16 sample periods before the first noise impulse in the step 166. Since a noise impulse may overlap two consecutive sample periods, the processor actually does not check for the occurrence of a noise impulse in the adjacent sample period, but does check for the occurrence of a noise impulse during the second through sixteenth preceding sample periods. Since, in the preferred embodiment, the data array maintains a history of only the previous 116 sample periods (approximately one 60 Hz cycle), a tail one-shot counter is used to determine whether a second noise impulse occurred in the second through sixteenth preceding sample periods. Operation of the tail one-shot counter is described in more detail below in connection with the flow chart of FIG. 5.

If a second noise impulse did not occur in the 16 sample periods preceding the first noise impulse, the processor determines whether a second noise impulse occurred in the 16 sample periods after the first noise impulse (step 168). This determination could be made by simply examining each of the bits which are 2 to 16 bit locations ahead of the bit corresponding to the first noise impulse. However, to provide greater speed and efficiency, a head one-shot counter is employed in the preferred embodiment in a manner described below to make this determination.

If a second noise impulse was determined to have occurred within 16 sample periods preceding or following the first noise impulse, the processor will reach step 168 in which the electronic switch 138 is actuated to pass the input signal for an interval of three sample periods. The three sample period duration of the interval in the illustrated embodiment was chosen to allow for small variations in the timing of noise impulses from a sparking power line (noise source jitter) and to allow for timing errors associated with sampling (detecting) the noise impulses. An output counter is loaded to time this interval while the processor proceeds to step 172.

In interrupt servicing step 172, the processor services interrupts from the noise impulse detection circuitry (comparator 114). In the preferred embodiment, interrupts to the processor are actually masked to prevent disruption of the program. However, as described above, any interrupt generated since the processor's last interrupt service step is stored in an internal flip-flop connected to the IRQ input 130. In the interrupt servicing step 172, the processor checks the flip-flop to determine whether a noise impulse occurred in the current sample period. If a noise impulse did occur, a bit corresponding to the current sample period is set (step 174). If no noise impulse occurred, the bit is cleared (step 176). Since, in the preferred embodiment, a record of only the sample periods in one 60 Hz cycle is kept, the bit associated with the critical sample period is overwritten in steps 174, 176. After the interrupt is serviced, the processor returns to the idling step 162.

Figure 5A:
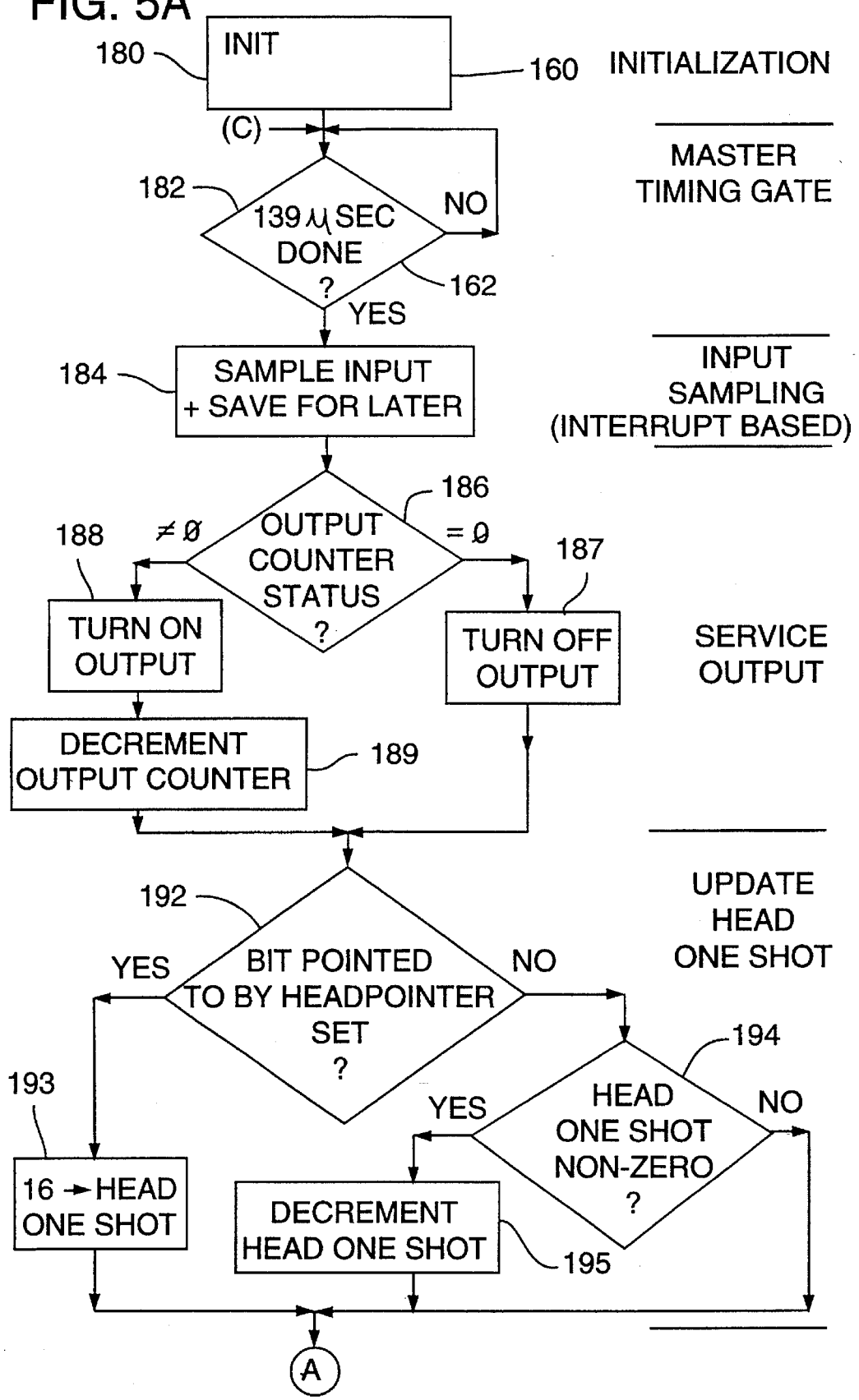
FIG. 5a–5c are more detailed flow charts of the process illustrated in FIG. 4.
Figure 5B:
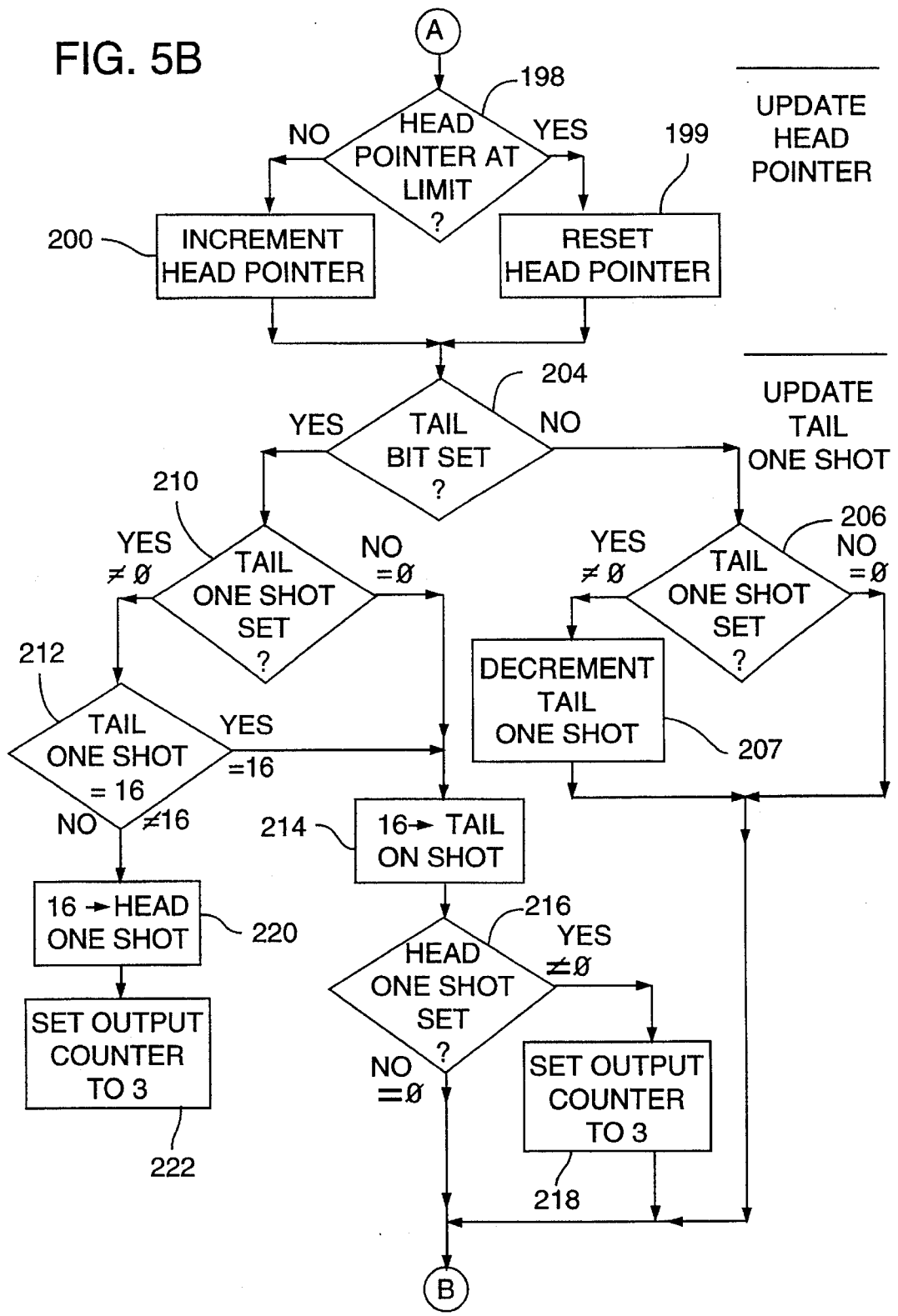
Figure 5C:
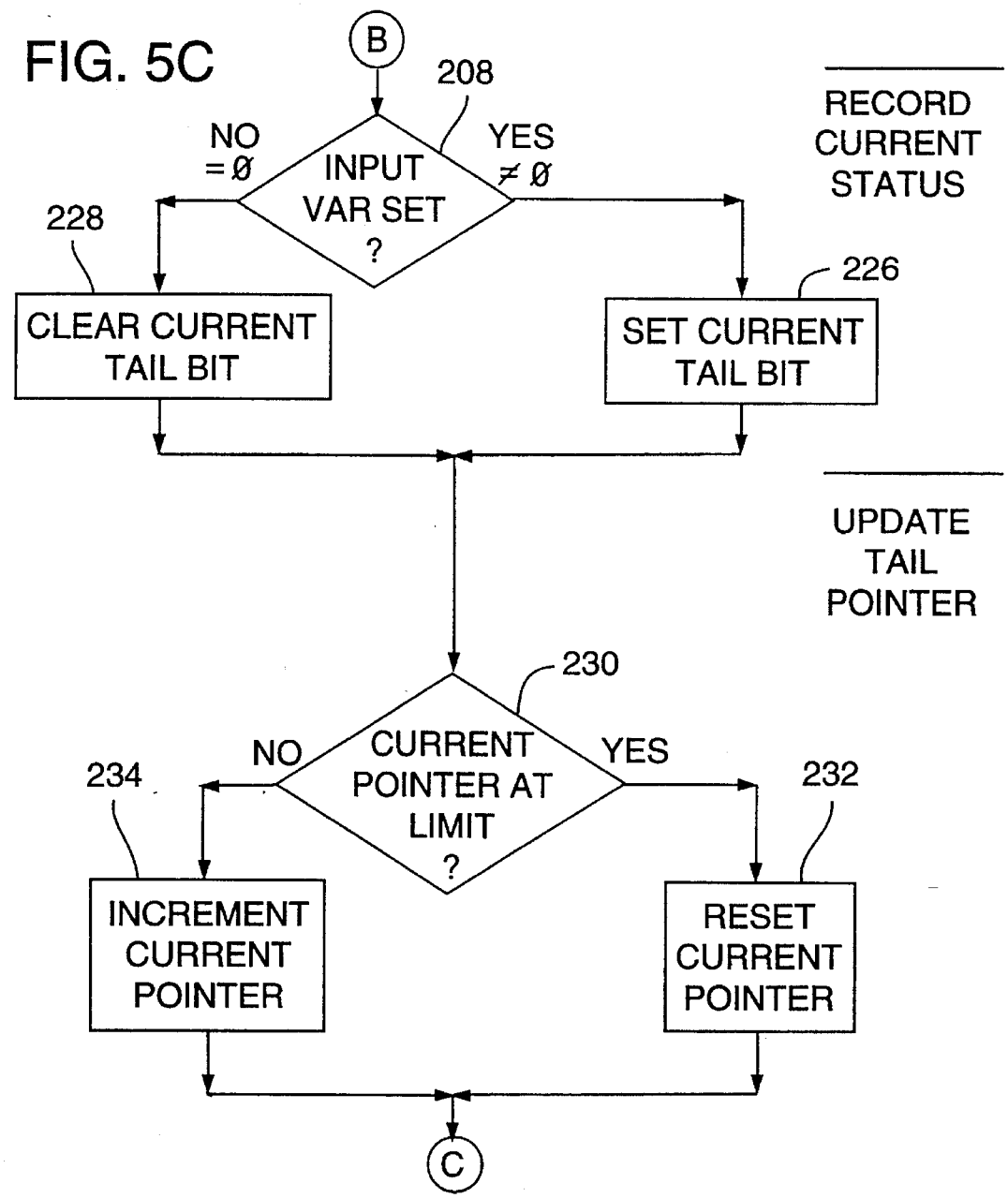

FIG. 5 is a more detailed flow chart of the preferred embodiment of the non-periodic noise blanking method (the procedure) of the present invention. Block 180 is the initialization step. In this step, the processor clears the data array in preparation for the procedure. Block 182 is the idling step which acts as a master timing gate. The processor idles at this point in the process until the completion of a sample period (139 microseconds in the preferred embodiment). The processor returns to this step after executing the entire procedure and before the next sample period is completed.

After the master timing gate, the first step 184 executed by the processor in a sample period is to sample the value stored in the processor's internal flip flop at the IRQ input 130. The value in the flip-flop is stored as a temporary variable for use later in the procedure.

Steps 186–189 are an output servicing routine. In order to continue actuation of the electronic switch 138 for three sample periods while the processor continues executing the procedure, the processor must track the duration of actuation. Thus, when the processor initially determines that the switch is to be actuated, the processor simply sets an output counter to three. In step 186, the processor checks the output counter. If the counter is zero, the processor turns off the switch control signal. As described above, this serves to blank the input signal to its average DC level. If, however, the output counter is not zero, the processor turns on the switch control signal (step 188) and decrements the output counter (step 189). In the preferred embodiment, the output counter is implemented using a byte of the processor's internal memory. The initial value of three is simply loaded into the memory initially and the value is later decremented as described above. The output counter could also be implemented using a dedicated hardware counter.

In steps 192–195, the processor executes a routine for updating the head one-shot counter. As described above, the head one-shot counter aids in determining whether a second noise impulse was detected in the sixteen sample periods after the critical sample period (the sample period which occurred one 60 Hz cycle previous to the current sample period). For this and other purposes during the procedure, the processor maintains two pointers to bit locations in the data array. A current pointer is associated with the bit location in which an indication of whether a noise impulse occurred in the current sample interval will be stored. Until that indication is stored, that bit location will still have stored in it an indication of whether a noise impulse occurred during the critical sample period. The processor also maintains a head pointer which is associated with a bit location that is sixteen bit locations ahead of the bit location associated with the current pointer.

In step 192, the processor checks the bit location associated with the head pointer. If the bit is set indicating that a noise impulse occurred during the corresponding sample period, the processor loads the head one-shot counter with the number sixteen. If, however, the bit is clear, the processor proceeds to step 194 in which the value in the head one-shot counter is checked. If the value in the head one-shot counter is non-zero, the counter is decremented in step 195. After execution of the routine, the head one-shot counter will indicate by having a non-zero value that a noise impulse occurred between 2 to 16 sample periods after the critical sample period. A zero in the head one-shot counter indicates that no noise impulses occurred in that interval.

The head pointer is updated in steps 198–199. In step 198, the processor compares the head pointer to its limit which is the pointer value of the last bit location in the data array. If the head pointer is at the limit, the processor resets the head pointer to the pointer value of the first bit location in the data array (step 199). Otherwise, the head pointer is incremented to point to the next adjacent bit location (step 200).

In the next step 204, the processor checks the bit location associated with the current pointer. If the bit is clear indicating that no noise impulse was detected in the critical sample period, the processor decrements the tail one-shot counter. The tail one-shot counter indicates whether a second noise impulse occurred within 2–16 sample periods preceding the sample period one 60 Hz cycle previous. First, in step 206, the processor checks to see if the tail one-shot counter is non-zero. If the tail one-shot counter is non-zero, the processor decrements it in step 207 and proceeds to step 208 without setting the output counter.

However, if the current bit is set indicating that a first noise impulse was detected in the critical sample period, the processor checks whether the tail one-shot counter is non-zero (step 210). If the tail one-shot counter is non-zero, indicating a noise impulse was also detected in the sixteen sample periods preceding the critical sample period, the processor checks whether the tail one-shot counter has a value of sixteen (step 212). A value of sixteen in the tail one-shot counter indicates that a noise impulse was detected in the sample period immediately preceding the critical sample period and may be an overlapping of the same first noise impulse in both the sample periods. Accordingly, if the tail one-shot counter has a value of sixteen, the tail one-shot counter is left with a value of sixteen (step 214) and the head one-shot counter is checked for a non-zero value (step 216).

If the head one-shot counter is zero (step 216), then there was no second noise impulse detected within sixteen sample periods of the first noise impulse. Since no noise impulses were detected within 16 sample periods before or after the first noise impulse, the processor proceeds to step 208 without setting the output counter. If the head one-shot counter is non-zero, however, a second noise impulse was detected in the sixteen sample periods following the first noise impulse. Therefore, the processor sets the output counter to three in step 218 so that a switch control signal will be turned on in step 188 of the following sample period.

If in step 212, the tail one-shot counter is determined to be non-zero and not equal to sixteen, the processor executes steps 220 and 222. A non-zero and not sixteen value in the tail one-shot counter indicates that a second noise impulse was detected in the sixteen sample periods preceding the critical sample period. The processor, therefore, sets the output counter to three in step 222 and loads the tail one-shot counter with sixteen in step 220 for subsequent sample periods.

Next, the processor executes a routine for recording an indication of whether a noise impulse occurred during the current sample period in the bit location associated with the current pointer. In step 208, the temporary variable in which the contents of the processor's internal flip-flop were stored is checked. If the temporary variable is set, then the bit associated with the current pointer is also set (step 226). If the temporary variable is clear, then the bit associated with the current pointer is also cleared (step 228).

Finally, the processor executes a routine for updating the current pointer. In step 230, the processor checks whether the current pointer is at its upper limit. If the current pointer is at its limit, the processor resets the current pointer to its lower limit in step 232. Otherwise, the processor increments the current pointer in step 234. After updating the current pointer the processor returns to the master timing gate 182 to repeat the procedure for the next sample period.

Having illustrated and described the principles of my invention with reference to a preferred embodiment, it should be apparent to those skilled in the art that the invention can be modified in arrangement and detail without departing from such principles. For example, while the invention has been illustrated with reference to a system designed to pass 60 Hz power line noise and block all other signals, it will be recognized that the same principles can be applied to block 60 Hz power line noise while passing all other signals. Such latter systems find widespread applicability in eliminating interference in television and other communication receivers.

Similarly, while the illustrated invention has been described as blocking undesired signals by opening a switch in the circuit path, it will be recognized that a similar effect can be achieved by closing a switch between the circuit path and ground, shunting the undesired signal to ground.

Still further, while the invention has been illustrated with reference to a system in which the signal switching is done in a relatively narrow bandwidth portion of the circuitry, it will be recognized that this function can advantageously be performed in other parts of the circuit. For example, if the switching is done in a wide bandwidth portion of the circuit, much faster switching intervals can be realized, minimizing disruption of a signal being filtered. This latter arrangement finds particular utility in noise blankers for television receivers, wherein a noise pulse might be blanked within a period much shorter than a single line on the television screen. In such applications, it is sometimes desirable to have a length of coaxial cable to serve as a delay line, so that the noise detection can be effected in an undelayed signal path, and then act to blank detected noise from the delayed signal line.

While the invention has been illustrated with reference to a system tailored for 60 Hz noise, it will be recognized that similar systems can be implemented for any other frequency. Indeed, with the advances in digital processing techniques and hardware, it is possible to implement a system that detects the frequency of a periodic noise signal and adapts operation of filter/blanker circuitry according to the present invention to act on noise of arbitrary frequency.

While the invention has been illustrated as including a comparator to detect noise impulses, it will be recognized that noise impulses can be detected in other ways. For example, noise impulses typically have a very fast rise time—as fast as the bandwidth of the circuitry permits. This characteristic of a noise impulse, rather than its amplitude, can be used in detection.

As a further example of alternatives to the comparator based noise detector, a multi-digit analog to digital converter and signal processor could instead be used to determine an average noise level of the input signal and detect noise impulses which deviate significantly therefrom.

As a still further example of alternatives to the illustrated comparator based noise detector, the threshold level of the comparator could be determined by AC coupling rather than the illustrated DC coupled multiplier threshold determination. With AC coupling, a running average of the peak-to-peak voltage of the input signal is determined. This average peak-to-peak voltage is multiplied by a constant to calculate an adaptive threshold value.

The method of distinguishing power line noise from other periodic noise is also susceptible to a number of variations. While the illustrated embodiment examines two successive cycles for indicia characteristic of power line sparking, other embodiments may examine three or more cycles, not necessarily successive. Further, other indicia may be used to distinguish power line sparking from other noise.

In view of the many possible embodiments to which the principles of my invention may be put, it should be recognized that the detailed embodiments are illustrative only and should not be taken as limiting the scope of my invention. Rather, I claim as my invention all such embodiments as may come within the scope and spirit of the following claims and equivalents thereto.

I claim:

1. A gating circuit for discriminating between first and second types of noise impulses, one of said types being periodic noise impulses, another of said types being random noise impulses, and for providing only pulses of a desired type to an output port, the apparatus comprising:

a circuit node having an input signal thereon, the input signal to be analyzed for the presence of noise;

an electronic switch having an input coupled to said circuit node and an output coupled to the output port;

a noise detector having an output for producing an output signal corresponding to the presence of a noise impulse at the circuit node;

an oscillator for providing a waveform having a reference periodicity;

a processor having a first input coupled to an output of the oscillator and a second input coupled to an output of the noise detector;

a memory associated with the processor;

the processor serving to store a datum in each of a plurality of memory locations in said memory, said datum indicating whether a noise impulse occurred in a time interval associated with said memory location;

the processor further providing an output signal that controls the instantaneous state of said electronic switch in accordance with data stored in said memory during a window of time a predetermined period earlier.

2. The apparatus of claim 1 in which the processor switches the state of the electronic switch only if said data previously stored indicates occurrence of two noise impulses within said window of time, said window of time being an interval during which an AC power waveform is near an extremum.

3. The apparatus of claim 1 in which the processor controls the electronic switch to effect passage of periodic noise impulses to the output port.

4. The apparatus of claim 1 in which the processor controls the electronic switch to effect blanking of periodic noise impulses from a signal provided to the output port.

5. The apparatus of claim 1 in which the electronic switch has its input connected to the output of the noise detector, wherein the electronic switch is coupled to said circuit node through the noise detector.

6. The apparatus of claim 1 in which the noise detector includes means for detecting a fast pulse rise time typically associated with a noise impulse.

7. The apparatus of claim 1 in which the noise detector includes a comparison circuit, the comparison circuit comparing the input signal with a threshold value, and providing said noise detector output signal only if the input signal exceeds the threshold value.

8. The apparatus of claim 7 which includes a circuit for producing a threshold value signal related to and greater than an average of the input signal, said threshold value signal being coupled to the comparison circuit.

9. The apparatus of claim 1 in which the input signal has a bandwidth in excess of 500 kilohertz to permit high frequency components of spark noise to be included therein.

10. The apparatus of claim 1 which further includes an audible indicator coupled to the output port for presenting an audio signal to a user, said audio signal corresponding to noise impulses passed through said electronic switch.

11. The apparatus of claim 1 which further includes a visual audible indicator coupled to the output port for presenting a visual output to a user, said vidual output corresponding to noise impulses passed through said electronic switch.

12. A method of discriminating periodically recurring noise from random noise on an input signal, the method comprising performing, at each of a succession of periodically spaced time intervals, the following steps:

detecting whether a noise pulse is present on said input signal during a present time interval, and storing a datum in a semiconductor memory indicating the presence or absence of such a pulse; and reading from said memory data stored during a window of time a fixed time before the present time interval, and controlling a switch in accordance therewith, said switch serving to control passage of the input signal to an output port.

13. The method of claim 12 which includes controlling the switch to blank periodically recurring noise from the signal passed to the output port.

14. The method of claim 12 which includes controlling the switch to pass only periodically recurring noise to the output port.

15. The method of claim 12 which includes controlling the switch in accordance with the presence or absence of data indicating detection of two or more noise pulses within said window.

16. The method of claim 12 in which the detecting step includes detecting a pulse rise time characteristic of a noise pulse.

17. The method of claim 12 in which the detecting step includes comparing the input signal with a threshold value signal, and indication detection of the noise pulse only when the input signal exceeds the threshold value.

18. The method of claim 17 which includes generating the threshold value signal by averaging a signal related to the input signal to yield an average value, and scaling said averaged value.

19. A temporal correlation method for controlling a gating circuit to discriminate periodic noise from non-periodic noise, the method including:

providing an input signal;

detecting the presence of a noise impulse in said input signal and producing an indicator signal corresponding thereto;

producing a delayed version of said indicator signal;

detecting indications of noise pulses in both the indicator signal and the delayed indicator signal within a fixed interval of one another, and producing a control signal in response thereto; and controlling the gating circuit in accordance with said control signal, said gating circuit serving to control passage of a signal related to the input signal to an output port.

20. The method of claim 19 which includes controlling the gating circuit to effect passage of periodic noise impulses to the output port.

21. The method of claim 19 which includes controlling the gating circuit to effect blanking of periodic noise impulses from the signal passed to the output port.

22. In a method of locating spark noise pulses in an electrical power distribution system, the method including using an antenna to receive radiated energy from the electrical power distribution system, and detecting said energy to produce a first signal that includes noise pulses, an improvement comprising:

determining an average value of the first signal;

scaling the determined average value by N to produce a threshold comparison signal, where N is at least three;

comparing the amplitude of the first signal with the threshold comparison signal;

passing an output signal to an output terminal only when the amplitude of the first signal exceeds the threshold comparison signal; and providing to a user an audible or visual representation corresponding to the output signal.

23. In an apparatus for locating spark noise pulses in an electrical power distribution system, the apparatus including an antenna coupled through RF and IF stages to provide a first signal, an improvement comprising:

an averaging circuit having an input and an output, the input being coupled to the first signal;

a multiplier circuit having an input coupled to the output of the averaging circuit and producing an output signal that is a scaled version of the output signal produced by the averaging circuit;

a comparator having first and second inputs, the first input being coupled to the input signal, and the second input being coupled to the output signal from the multiplier circuit, the comparator producing an output signal when the input signal exceeds the multiplier output signal; and output means for presenting a signal corresponding to the comparator output signal to a user;

wherein components of the first signal that do not have the amplitude characteristics of spark noise are not included in the signal presented to the user.

24. The apparatus of claim 23 in which the bandwidth of the first signal is in excess of 500 kilohertz to permit high frequency components of spark noise to be included therein.

25. The apparatus of claim 23 in which the output means includes an audible indicator for presenting an audio signal to the user.

26. The apparatus of claim 23 in which the output means includes a visual indicator for present a visual output to the user.

27. The apparatus of claim 23 which further includes a band pass filter between the IF stage and the averaging circuit.

* * * * *